United States Patent [19]

Anderson et al.

[11] Patent Number: 5,657,879

[45] Date of Patent: Aug. 19, 1997

[54] COMBINATION WAFER CARRIER AND STORAGE DEVICE

[75] Inventors: Douglas G. Anderson; Jason D. Jordan, both of Vancouver, Wash.

[73] Assignee: SEH America, Inc., Vancouver, Wash.

[21] Appl. No.: 596,956

[22] Filed: Feb. 5, 1996

[51] Int. Cl.⁶ ........................................ A47F 7/00
[52] U.S. Cl. ........................................ 211/41.18
[58] Field of Search ................ 211/41, 40; 118/500; 206/454

[56] References Cited

U.S. PATENT DOCUMENTS

| | | |
|---|---|---|
| D. 338,991 | 8/1993 | Naito et al. . |
| D. 344,386 | 2/1994 | Ogino . |
| 4,388,140 | 6/1983 | Nakazato et al. . |
| 4,743,156 | 5/1988 | Raffay et al. . |
| 4,872,554 | 10/1989 | Quernemoen .................. 211/41 X |
| 4,949,848 | 8/1990 | Kos ................................ 211/41 |
| 4,993,559 | 2/1991 | Cota .............................. 211/41 |
| 5,193,682 | 3/1993 | Naito et al. . |
| 5,228,568 | 7/1993 | Ogino et al. . |
| 5,390,811 | 2/1995 | Ogino et al. . |

Primary Examiner—Alvin C. Chin-Shue
Assistant Examiner—Sarah L. Purol
Attorney, Agent, or Firm—Chernoff, Vilhauer, McClung & Stenzel

[57] ABSTRACT

A combination wafer carrier and basket-like storage device that includes insertable and removable plates for adjustment of capacity, as well as insertable and removable basket-like sleeves for adaptation to various-sized wafers.

12 Claims, 5 Drawing Sheets

COMBINATION WAFER CARRIER AND STORAGE DEVICE

This invention relates to improvements in handling and storage containers for silicon semiconductor wafers during the course of their manufacture.

BACKGROUND OF THE INVENTION

The handling and storage of expensive silicon wafers during the course of fabrication of semiconductor devices is problematic due to the fragility of the wafer material and to storage space limitations. Because semiconductor wafer production involves many distinct steps, including slicing, edge grinding, lapping and cleaning, there is a need for a device to store and protect the wafers between such steps. Currently, this need is filled by wafer storage cassettes. However, such cassettes are highly inefficient in that they must be loaded and unloaded by handling each individual wafer and spatially reorienting the wafers both upon loading and unloading, often causing contamination and breakage; they are cumbersome to handle; and they occupy an unreasonably large amount of floor or shelf space. These shortcomings are overcome by the present invention, which is summarized and described in detail below.

SUMMARY OF THE INVENTION

The present invention comprises a basket-like container for handling and storage of semiconductor wafers that are in production, the container being adjustable both with respect to the size of wafers it can accommodate and in overall capacity and further being adaptable to receive wafers in the same orientation they are found in a conventional semiconductor wafer production line.

DETAILED DESCRIPTION OF PREFERRED EMBODIMENT

Figure 1:
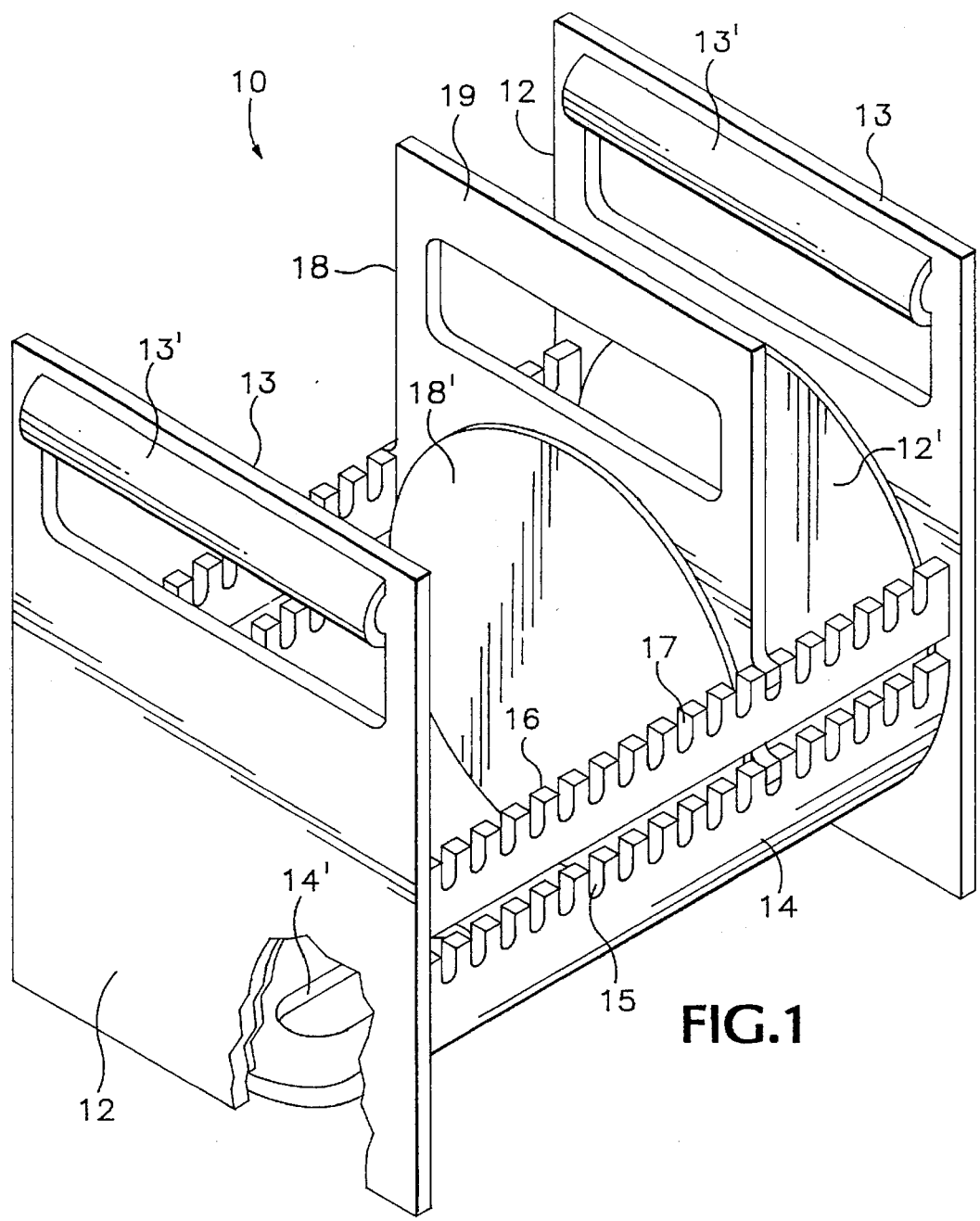
FIG. 1 is a combination perspective and cutaway view of an exemplary device of the present invention.
Figure 2:
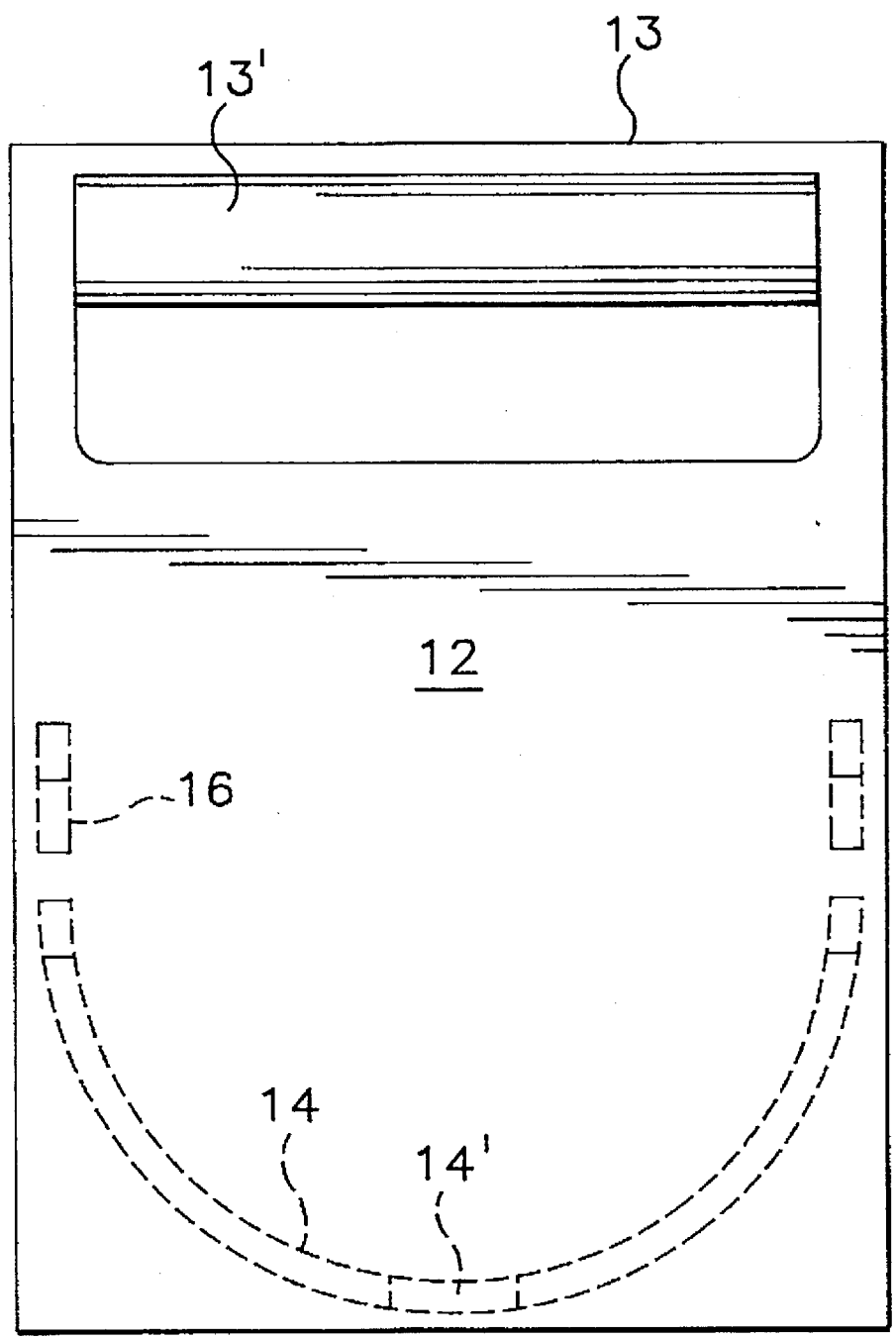
FIG. 2 is an end view of the same device.
Figure 3:
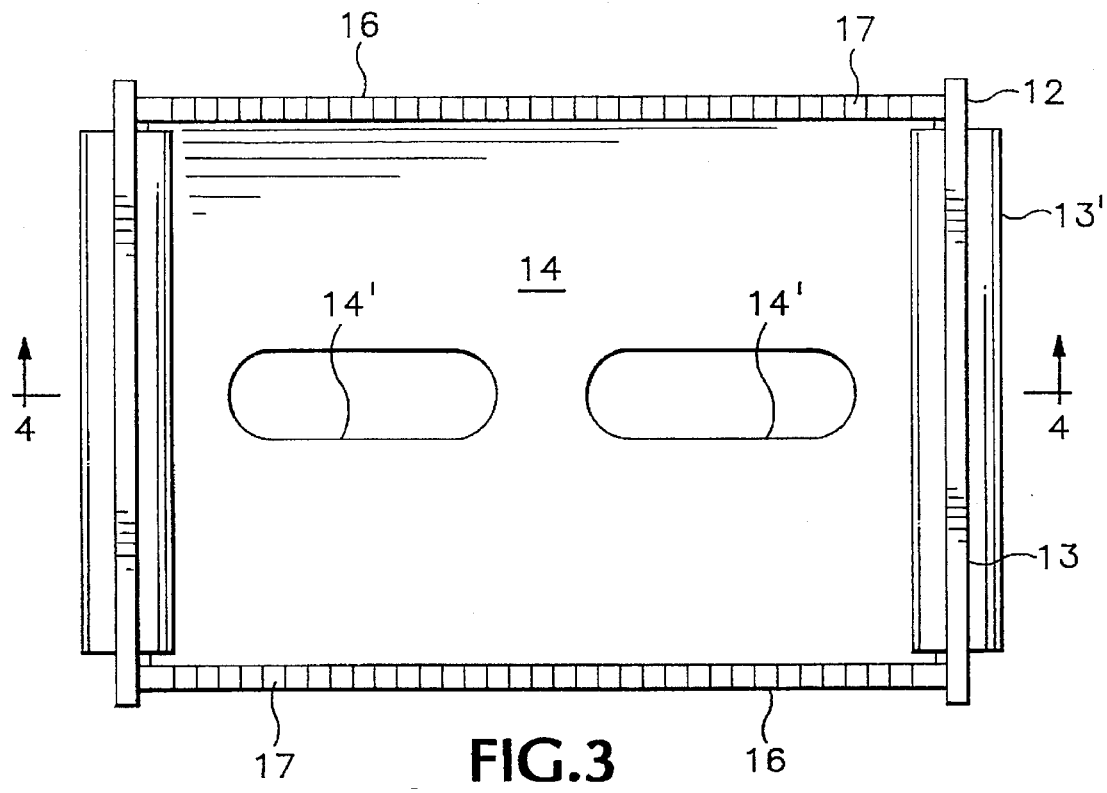
FIG. 3 is a plan view of the same device.
Figure 4:
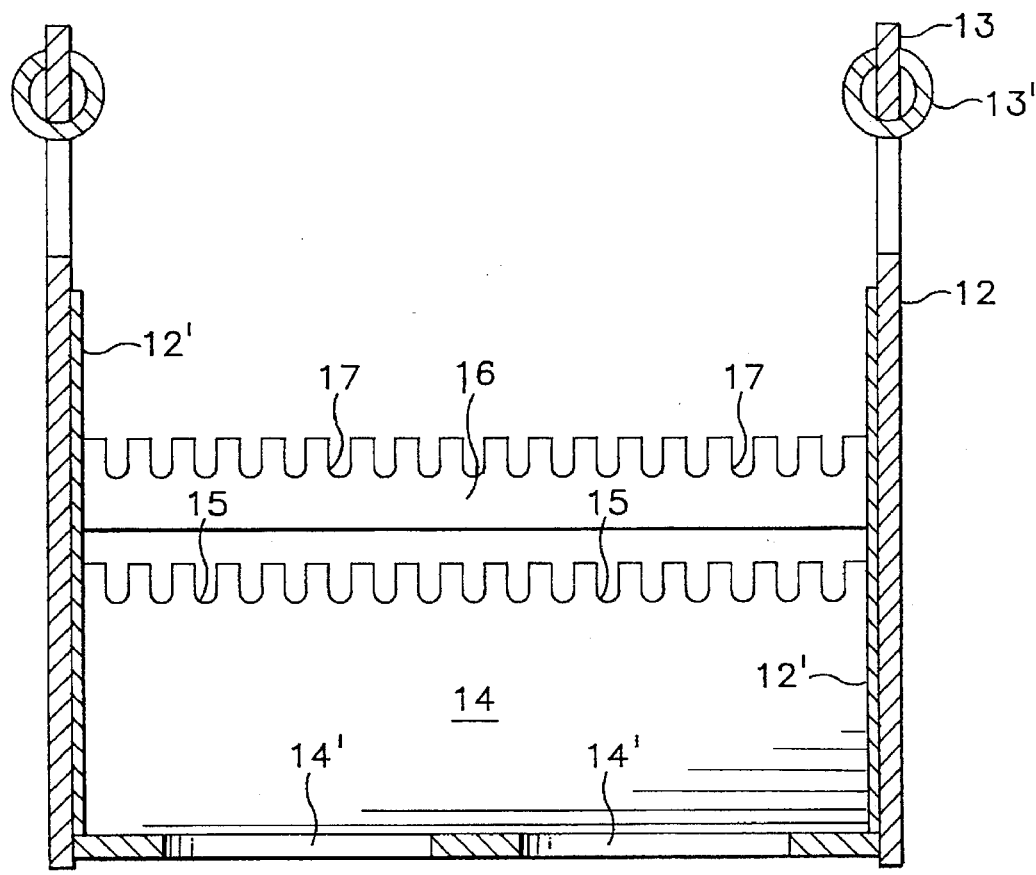
FIG. 4 is a cross-sectional view of the device, taken through the plane 4—4 of FIG. 3.

Referring to the drawings, wherein like numerals generally refer to the same elements, there is shown in FIGS. 1–4 a silicon wafer basket 10 comprising end plates 12 secured to a longitudinal U-shaped radiused wafer retainer 14 and longitudinal rails 16. Wafer retainer 14 may be provided with appropriately sized insertable sleeves (described below) so as to accommodate wafer discs of smaller diameters. The upper portions of wafer retainer 14 and rails 16 are provided with notches 15 and 17, respectively, for engaging stabilizer plates, also described below. The radius of the lower portion of wafer retainer 14 is approximately the same as that of the wafers that are desired to be accommodated. End plates 12 are preferably provided with a circular resilient pad 12' for compressive engagement with a stack of edge-stacked wafers, and are cut out in their upper portions so as to provide handles 13, which in turn may be padded with grips 13'. Wafer retainer 14 has holes or slots in its lower portion that function as drain trenches 14'.

Figure 6:
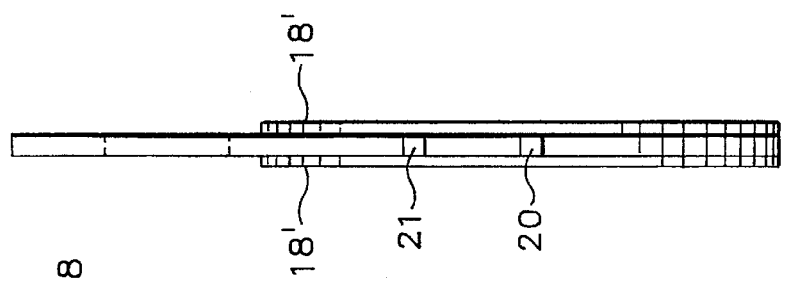
FIG. 6 is a side view of the stabilizer plate shown in FIG. 5.
Figure 5:
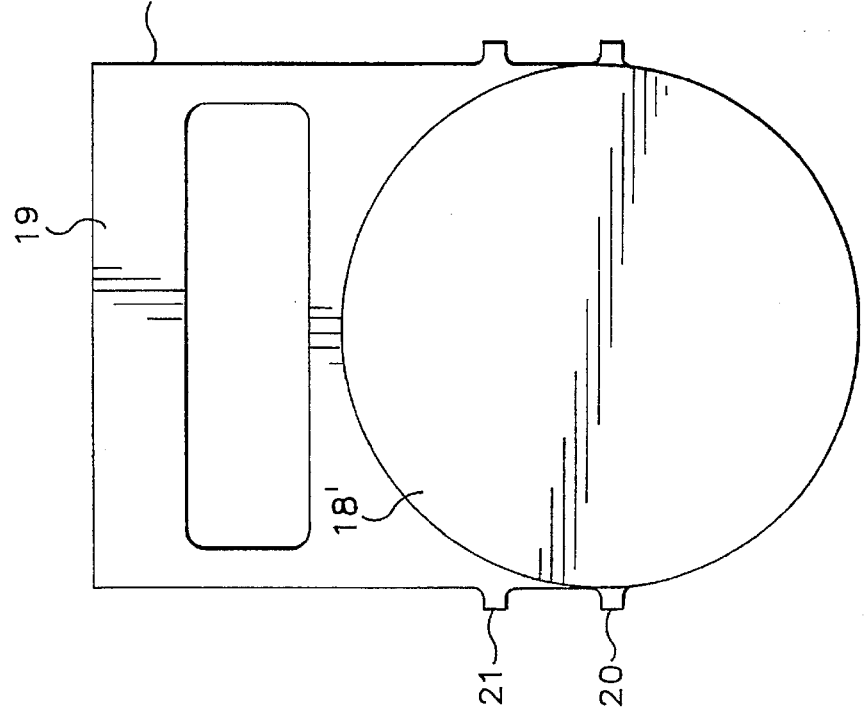
FIG. 5 is a front view of one type of a stabilizer plate of the device of the present invention.

FIGS. 5–6 show one type of a stabilizer plate 18 provided with lower and upper lugs 20 and 21, respectively, for engagement with wafer retainer notches 15 and rail notches 17, respectively. The upper portion of stabilizer plate 18 may also be cut out to provide a handle 19 for ease in insertion into and removal from the wafer basket 10, and one or both faces of the stabilizer plate may be provided with circular pads of resilient polymer 18' for compressive engagement with the end of one or more stacks of edge-stacked wafers. The radius of the lower portion of stabilizer plate 18 is slightly less than that of wafer retainer 14, so as to be readily engagable and disengagable therewith. Stabilizer plate 18 is inserted into engagement with the notches in the upper portions of wafer retainer 14 and rails 16 at the desired location so as to permit wafer basket 10 to accommodate an adjustable number of wafers. Multiple stabilizer plates may be utilized to secure and segregate different types of wafers within the same basket.

Figure 7:
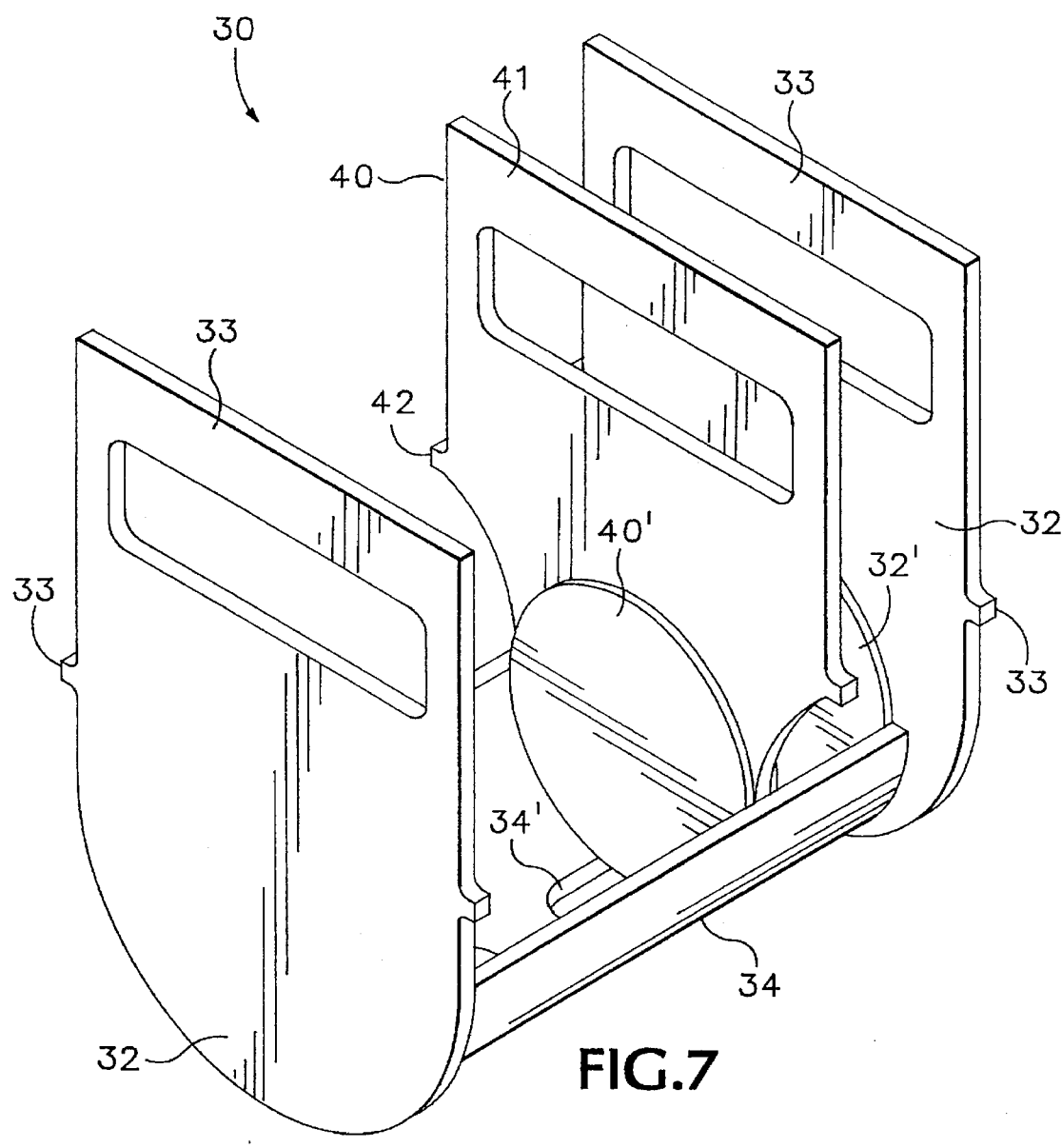
FIG. 7 is a perspective view of an insertable sleeve to accommodate a smaller diameter wafer, also showing the stabilizer plate of FIG. 8 in place.

FIG. 7 depicts a basket-like insertable sleeve 30 to accommodate smaller diameter wafers, the sleeve comprising two radiused end plates 32 provided with circular resilient pads 32', and joined together by U-shaped radiused insert wafer retainer 34, which in turn is provided with holes or slots to function as insert drains 34'. Radiused end plates 32 are provided with insert lugs 33 to engage notches 15 of rails 16, the notches preferably being in close proximity to end plates 12, and the radii thereof are approximately the same as that of wafer retainer 14 so as to fit snugly within silicon wafer basket 10. The radius of sleeve wafer retainer 34 is approximately the same as that of the wafers desired to be accommodated therein, and it will readily be understood that any size sleeve may be fabricated to accommodate virtually any size wafers.

Figure 8:
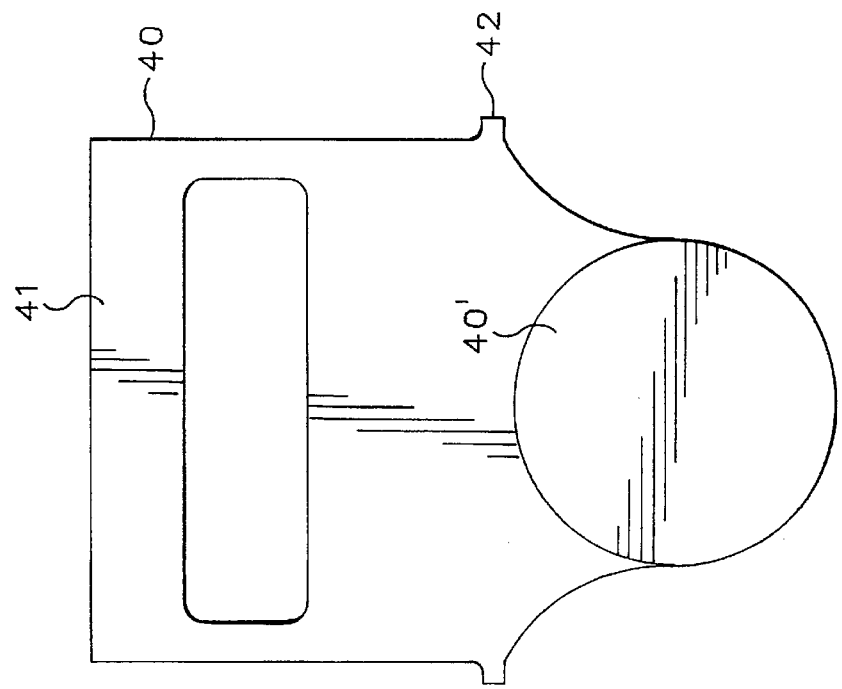
FIG. 8 is a front view of another type of stabilizer plate to be used in connection with the insert shown in FIG. 7.

FIG. 8 depicts a sleeve stabilizer plate 40, preferably provided with resilient pads 40' on one or both sides for compressive engagement with the end of one or more stacks of edge-stacked wafers. Sleeve stabilizer plate 40 is also provided with a cut-out portion so as to form a sleeve stabilizer plate handle 41, and is further provided with sleeve stabilizer plate lugs 42 for engagement with notches 15 of rails 16. The radius of the lower portion of sleeve stabilizer plate 40 is preferably slightly less than the radius of insert wafer retainer 34, so as to be readily engagable and disengagable therewith. As is the case with stabilizer plate 18, multiple insert stabilizer plates 40 may be used to secure and segregate different types of wafers within the same insertable sleeve.

In operation, the silicon wafer basket 10 is lowered into a water tub containing sliced wafers that are stacked on edge in the same manner as coins in a coin counter, and under the wafers, then raised so that the edges of the wafers engage the bottom portion of wafer retainer 14, thereby to remove the wafers from the tub and hold them in storage for the next production step such as edge grinding, lapping or etching. Excess water drains out through the drain trenches, and to the extent necessary, one or more stabilizer plates are put in place with their resilient pads compressively engaging the ends of a stack of edge-stacked wafers. Since the next production step after sluicing generally also calls for the wafers to be oriented on edge, no reorientation of the wafers is required. And because the wafers may be removed and stored en masse, the possibility of contamination and breakage that comes with the handling of each individual wafer is eliminated. In terms of floor and shelf storage space, the wafer basket of the present invention holds approximately four times the number of wafers as conventional cassette storage devices. Furthermore, because of its design, it is much easer to handle, requiring little or no flexing of the wrist joints of the user.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A silicon wafer handling and storage container comprising:
   (a) a longitudinal radiused wafer-retaining trough adapted to receive and retain silicon wafer discs on edge, said trough having notches along its upper edges adapted for engaging lugs of at least one insert plate;
   (b) two notched longitudinal rails adapted for engaging lugs of at least one insert plate;
   (c) two end plates engaging said radiused wafer-retaining trough and said longitudinal rails; and
   (d) at least one insert plate with lugs adapted to engage the radiused portion of said radiused wafer-retaining trough and said lugs of said insert plate are adapted to engage the notches of both said radiused wafer-retaining trough and said longitudinal rails.

2. The container of claim 1, including radiused handles integral with said end plates.

3. The container of claim 1, including at least one drain in the bottom of said radiused wafer-retaining trough.

4. The container of claim 1 wherein the radius of said radiused wafer-retaining trough is approximately the same as the radius of a silicon wafer.

5. The container of claim 1, including resilient pads on said end plates.

6. The container of claim 1, including at least one resilient pad on said at least one insert plate.

7. The container of claim 1, including a handle on said at least one insert plate.

8. The container of claim 1, including an insertable and removable sleeve basket, said sleeve basket comprising a radiused wafer-retaining sleeve member having at least one drain therein, and two radiused end plates with lugs adapted for engagement with the notches of said two longitudinal rails.

9. The container of claim 8 wherein the radius of said radiused wafer-retaining sleeve member is smaller than the radius of said radiused wafer-retaining trough and the radius of said two radiused end plates is approximately the same as the radius of said radiused wafer-retaining trough.

10. The container of claim 8, including at least one sleeve insert with lugs adapted for engagement with said notches of said two longitudinal rails.

11. The container of claim 10, including handles on said radiused end plates and said sleeve insert plate.

12. The container of claim 10, including resilient pads on said radiused end plates and at least one resilient pad on said sleeve insert plate.

* * * * *